United States Patent [19]

Kuga

[11] Patent Number: 5,614,854

[45] Date of Patent: Mar. 25, 1997

[54] SAMPLE/HOLD CIRCUIT HAVING AN ANALOG-TO-DIGITAL CONVERTER AND A NONVOLATILE MEMORY FOR STORING HOLD VOLTAGE DATA IN DIGITAL FORM

[75] Inventor: Kaeko Kuga, Kyoto, Japan

[73] Assignee: Rohm Co., Ltd., Kyoto, Japan

[21] Appl. No.: 519,954

[22] Filed: Aug. 28, 1995

[30] Foreign Application Priority Data

Aug. 31, 1994 [JP] Japan .................................. 6-207638

[51] Int. Cl.⁶ .................................................. G11C 27/02
[52] U.S. Cl. ............................ 327/94; 327/100; 341/110; 341/122
[58] Field of Search ..................... 327/91, 94, 97, 327/100, 104; 341/110, 118, 122, 124, 125, 126, 144, 155

[56] References Cited

U.S. PATENT DOCUMENTS

| | | | |
|---|---|---|---|
| 3,715,509 | 2/1973 | Dawson | 364/485 |
| 3,772,679 | 11/1973 | Scheer | 341/110 |
| 4,136,396 | 1/1979 | Hansford | 327/94 |
| 4,142,146 | 2/1979 | Schumann et al. | 327/94 |
| 4,308,585 | 12/1981 | Jordan | 395/115 |
| 4,353,060 | 10/1982 | Endoh et al. | 341/110 |
| 4,359,690 | 11/1982 | Tucker et al. | 327/94 |
| 4,463,272 | 7/1984 | Tucker | 327/94 |
| 4,578,667 | 3/1986 | Hollister | 341/122 |
| 4,673,916 | 6/1987 | Kitamura et al. | 327/91 |
| 4,734,677 | 3/1988 | Cake et al. | 327/91 |
| 4,827,259 | 5/1989 | Murphy et al. | 327/94 |
| 4,878,185 | 10/1989 | Brand et al. | 327/94 |
| 5,006,850 | 4/1991 | Murphy | 341/110 |
| 5,404,379 | 4/1995 | Shyue et al. | 327/91 |
| 5,416,480 | 5/1995 | Roach et al. | 341/110 |

Primary Examiner—Timothy P. Callahan
Assistant Examiner—My-Trang Nu Ton
Attorney, Agent, or Firm—Brumbaugh, Graves Donohue & Raymond

[57] ABSTRACT

A sample/hold circuit which receives a voltage level at the input terminal thereof at a specific timing, and outputs the received voltage level in the form of a hold voltage. The sample/hold circuit includes an analog-to-digital converter for receiving a voltage level at the input terminal thereof, a memory element for storing the received voltage level in the form of hold voltage data, and a digital-to-analog converter for outputting the hold voltage data. The sample/hold circuit may be fabricated into a one-chip integrated circuit. The memory element may be a nonvolatile and reprogrammable memory.

7 Claims, 2 Drawing Sheets

5,614,854

SAMPLE/HOLD CIRCUIT HAVING AN ANALOG-TO-DIGITAL CONVERTER AND A NONVOLATILE MEMORY FOR STORING HOLD VOLTAGE DATA IN DIGITAL FORM

BACKGROUND OF THE INVENTION

1. Field of the Invention

The present invention relates to a sample/hold circuit, and more particularly to a circuit arrangement of a sample/hold circuit.

2. Discussion of the Related Art

As known, the sample/hold circuit receives a voltage level at the input terminal thereof at a specific timing, and outputs the received voltage level in the form of a hold voltage.

A typical conventional sample/hold circuit is shown in FIG. 4. As shown, the sample/hold circuit is made up of buffer circuits B1 and B2 for impedance conversion at the input and the output terminals Vi and Vo, switching elements S1 and S2 for connection and disconnection of a signal, and capacitors 5 and 6 for holding a received voltage level.

The buffer circuit B1 has a non-inverting input terminal, an inverting input terminal, and an output terminal. The non-inverting input terminal of the buffer circuit B1 is connected to the input terminal Vi. The inverting input terminal of the buffer circuit B1 is connected to the output terminal of the buffer circuit B1 per se in a feedback fashion. The output terminal of the buffer circuit B1 is connected through the switching element S1 to the capacitor 5, and further to the non-inverting input terminal of the buffer circuit B2 and the capacitor 6, through the switching element S2. The output terminal of the buffer circuit B2 is connected to the output terminal Vo, and to the inverting input terminal of the buffer circuit B2 per se in a feedback fashion. The switching elements S1 and S2 are turned on and off under control signals L1 and L2 outputted from a control circuit 4.

A timing chart showing an operation of the conventional sample/hold circuit arranged as shown in FIG. 4 is shown in FIG. 5.

In a sampling mode of the sample/hold circuit, the switching element S1 is turned on by the control signal L1, while the switching element S2 is turned off by the control signal L2. In the sampling mode, the sample/hold circuit receives an input voltage.

In a holding mode, the switching element S1 is turned off, while the switching element S2 is turned on, under control of the control circuit 4. In the holding mode, the sample/hold circuit holds the received voltage in the capacitor 5, and o outputs the held voltage to the output terminal Vo by way of the buffer circuit B2.

In the sampling mode, the voltage level at the input terminal Vi is applied to the capacitor 5 as it is. The output voltage is retained in the capacitor 6 of which the capacitance is remarkably smaller than that of the capacitor 5. The voltage at the input terminal Vi varies as indicated by dotter lines (waveform at Vo in FIG. 5) when it is inputted to the capacitor 5.

The sample/hold circuit shown in FIG. 4 can be realized by a simple circuit arrangement. However, the sample/hold circuit merely holds the voltage in the capacitors 5 and 6, after receiving the voltage from the input terminal Vi. Because of this, the sample/hold circuit suffers from some problems.

Firstly, the hold voltage gradually varies as in the segment t1 in FIG. 5. This is due to the leakage of current from the capacitor 5 or 6. Secondly, the hold voltage abruptly varies as in the segment t2 in FIG. 5 or the voltage at the output terminal Vo is greatly deviated from the hold voltage as received. This problem arises from noise generated in the power supply line or the circuit. Particularly where the hold time is long under the condition of high temperature or much noise is present, the deviation or the drift of the hold voltage is appreciable. Thirdly, when the sample/hold circuit operates in the holding mode, the capacitor 6 is coupled in parallel with the capacitor 5. In this state, the hold voltage across the capacitor 5 is sheared to the capacitor 6, so that the hold voltage varies.

An attempt to increase the capacitances of the capacitors 5 and 6 succeeds in suppressing the voltage variation caused by the leak current from the capacitors 5 and 6 and the abrupt variation of the voltage by the noise voltage. However when the capacitors 5 and 6 are excessively increased in capacitance, it is impossible to integrate the sample/hold circuit containing those capacitors into a single chip. In other words, the capacitors must be incorporated, as external components, into a single chip of the integrated circuit. This runs counter to the current design trend to reduce the number of external components.

In the conventional sample/hold circuit, when the power source is turned off, the capacitors are discharged, so that the held voltage varies. For this reason, the sample/hold circuit must be operated for the sample/hold purposes every time the power source thereof is turned on. This hinders a quick start-up of the system.

SUMMARY OF THE INVENTION

Accordingly, an object of the present invention is to provide a sample/hold circuit in which no variation of the hold voltage takes place, the hold voltage data can be used as the correct one immediately after the power source is turned on, and the capacitors, together with the remaining circuit elements, can be fabricated into a single chip of the integrated circuit.

To achieve the above object, there is provided a sample/hold circuit which receives a voltage level at an input terminal thereof at a specific timing, and outputs the received voltage level in the form of a hold voltage, the sample/hold circuit including: analog-to-digital converting means for receiving a voltage level at an input terminal thereof and converting the received voltage level into digital data; memory means for storing the digital data in the form of hold voltage data; and digital-to-analog converting means for converting the hold voltage data into an analog signal and outputting the analog signal in the form of a hold voltage.

BRIEF DESCRIPTION OF THE DRAWINGS

Other objects, features, and advantages of the present invention will be apparent when carefully reading the following detailed description in connection with the accompanying drawings, in which.

DETAILED DESCRIPTION OF THE PREFERRED EMBODIMENTS

Figure 1:
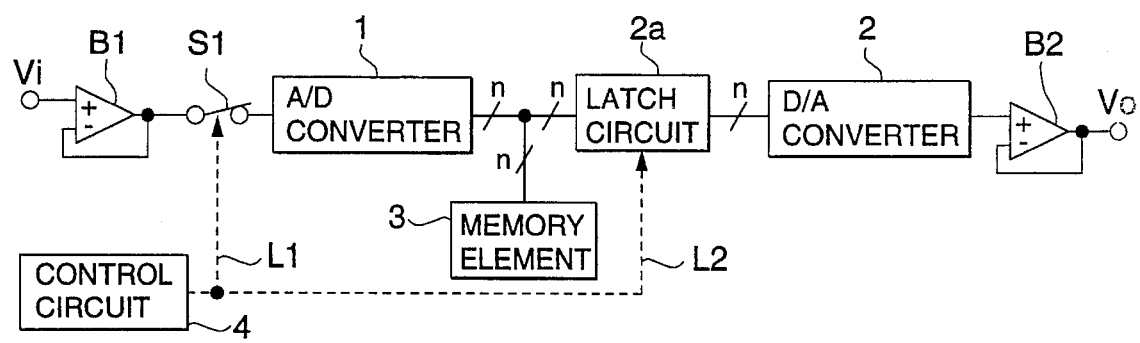
FIG. 1 is a block diagram showing a sample/hold circuit according to an embodiment of the present invention.

The preferred embodiments of a sample/hold circuit according to the present invention will be described with reference to FIGS. 1 through 3. Throughout the drawings, like reference numerals are used for designating like or equivalent portions, for simplicity.

The sample/hold circuit of the present embodiment is arranged as shown in FIG. 1. The sample/hold circuit includes buffer circuits B1 and B2 for impedance conversion at the input and the output terminals Vi and Vo, a switching element S1 for connection and disconnection of a signal flow, the switching element being a transistor element, such as a MOS transistor or a bipolar transistor, an analog-to-digital (A/D) converter 1 for converting an analog signal to a digital signal, a digital- to-analog (D/A) converter 2 for converting a digital signal to an analog signal, a latch circuit 2a for latching the hold voltage data to be transmitted to the D/A converter 2, a memory element 3 for storing the signal from the A/D converter 1, and a control circuit 4, such as a one-chip microprocessor, for controlling the on/off operation of the switching element S1.

The input terminal Vi is connected to the non-inverting input terminal of the input buffer circuit B1. The output terminal of the buffer circuit B1 is connected to the inverting input terminal thereof in a feedback fashion, and further to the input terminal of the A/D converter 1 by way of the switching element S1. The output terminal of the A/D converter 1 is connected to the memory element 3 through an n-bit wide data bus, and to the input terminal of the latch circuit 2a. The output terminal of the latch circuit 2a is connected to the input terminal of the D/A converter 2. The output terminal of the D/A converter 2 is connected to the non-inverting input terminal of the output buffer circuit B2. The output terminal of the buffer circuit B2 is connected to the output terminal Vo, and to the inverting input terminal of the buffer circuit per se. The control circuit 4 produces at least two types of control signals, a control signal L1 and a control signal L2. The control signal L1 is used for controlling the on/off operation of the switching element S1. The control signal L2 is used for controlling the latching timing of the latch circuit 2a.

The memory element 3 may be a memory element of the type which is electrically reprogrammable and nonvolatile, that is, capable of retaining data without the aid of a power source, such as a ferroelectric memory device, a FLASH memory device, or an EEPROM device. The A/D converter 1 may be any of various types of A/D converters in accordance with the circuit scale and the required performances. The A/D converters are categorized into low-and medium-speed A/D converters of the follow-up or sequential comparison type, and a high speed A/D converter of the flash type. The D/A converter 2 may be of the resistor weighting type, the voltage addition type, the current addition type, or the like. The output buffer circuit B2 may be omitted when the input impedance of a circuit for receiving voltage from the output terminal Vo is high. The input buffer circuit B1 may be also omitted when the input impedance of the A/D converter used is high.

It is noted that the memory element 3 of the above-mentioned type, which can retain data irrespective of the on/off of the power source, is used. Because of this, when the power source is turned on again, the data stored before the power source is turned off can be used again immediately. In other words, a waiting time when the system starts up is reduced. Further, the sample/hold circuit of the present embodiment can sample and hold a plural number of voltages in a manner that in a sampling mode, the hold data are successively stored into the memory element 3, and in a holding mode, the stored data are successively read out.

Figure 2:
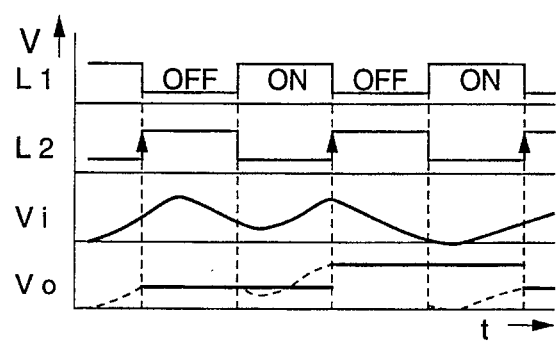
FIG. 2 is a timing chart showing the operation of the sample/hold circuit of FIG. 1.

FIG. 2 is a timing chart showing the operation of the sample/hold circuit of FIG. 1. When the control signal L1 turns on the switching element S1, a sampling mode is set up. In this mode, the voltage at the input terminal Vi is allowed to enter into the A/D converter 1. When the control signal L1 turns off the switching element S1, a holding mode is set up. In this mode, at the leading edge of the control signal L2, which is substantially synchronized with the control signal L1, the hold data of n bits is stored into the memory element 3, while at the same time is latched in the latch circuit 2a. The hold voltage is outputted from the output terminal of the D/A converter 2. The output voltage from the D/A converter 2 is outputted to the output terminal Vo, through the buffer circuit B2. In the row of Vo in FIG. 2, curves indicated by dotted lines indicate variations of the voltage at the input terminal Vi to be inputted into the A/D converter 1. During the sampling period where the switching element S1 is turned on, the sample/hold circuit continues the A/D converting operation.

Figure 3:
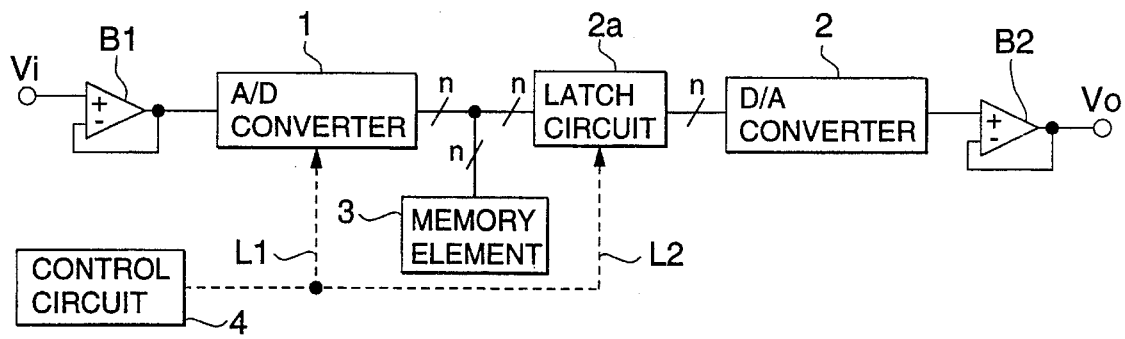
FIG. 3 is a block diagram showing a sample/hold circuit according to another embodiment of the present invention.
Figure 4:
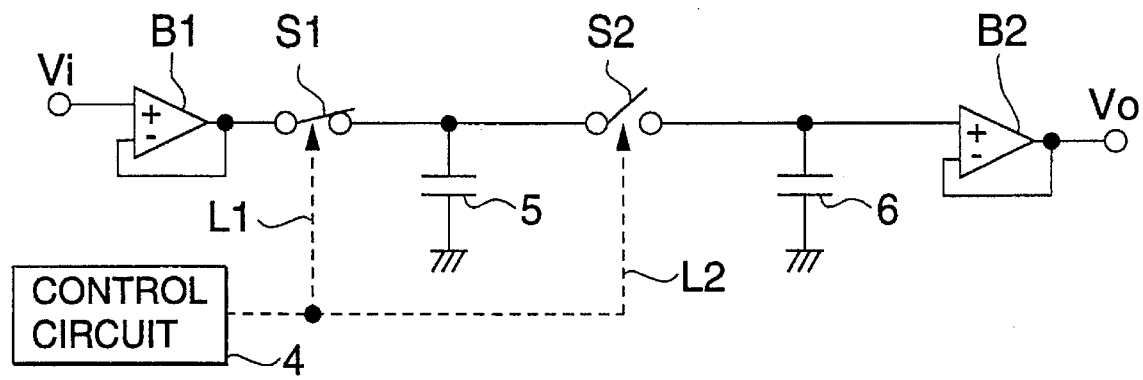
FIG. 4 is a block diagram showing a conventional sample/hold circuit.
Figure 5:
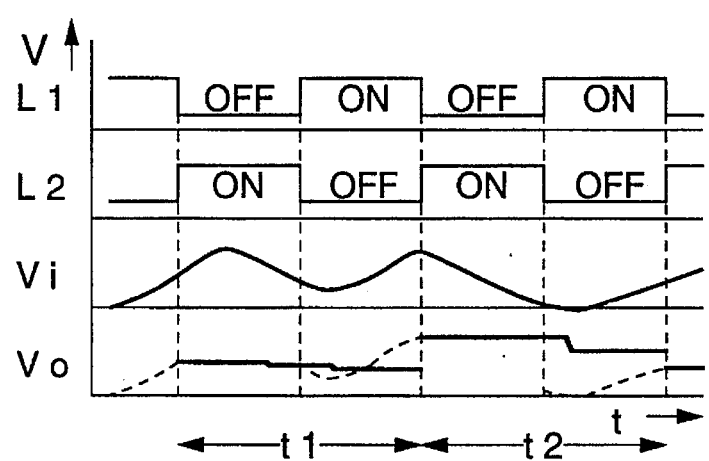
FIG. 5 is a timing chart showing tile operation of the conventional sample/hold circuit of FIG. 4.

FIG. 3 is a block diagram showing a sample/hold circuit according to another embodiment of the present invention. In the second embodiment, the control signal L1 of the control circuit 4 directly controls the operation and the stop of the A/D converter 1, while in the first embodiment, it is used for controlling the on/off operation of the switching element S1. Therefore, the switching element S1 is not used in the second embodiment. The remaining circuit arrangement of the second embodiment is the same as that of the first embodiment, and hence no further explanation thereof will be given.

As seen from the foregoing description, the voltage held by the sample/hold circuit of the present invention little varies with time. Accordingly, a stable held voltage can be produced any time. Further, the sample/hold circuit per se may be fabricated into a one-chip integrated circuit since no capacitors with a large capacitance are used.

What is claimed is:

1. A sample/hold circuit which receives a voltage level at an input terminal thereof at a specific timing, and outputs the received voltage level in the form of a hold voltage, said sample/hold circuit comprising:

analog-to-digital converting means for receiving a voltage level at an input terminal thereof and converting the received voltage level into digital data;

latch means for receiving digital data from the analog-to-digital data converting means and latching the data to the digital-to-analog converting means in the form of a hold voltage;

nonvolatile memory means for receiving digital data from the analog-to-digital converting means and storing the digital data in the form of hold voltage data and for supplying the hold voltage data to the latch means;

digital-to-analog converting means for converting the hold voltage data into an analog signal and outputting the analog signal in the form of a hold voltage; and control means for controlling the operation of the sample/hold circuit alternatively between a sampling mode wherein a voltage level is received by the analog-todigital converting means and converted into digital data and a holding mode wherein no voltage level is received by the analog-to-digital converting means while a hold voltage is outputted from the digital to analog converting means.

2. The sample/hold circuit according to claim 1, wherein said sample/hold circuit is fabricated into a one-chip integrated circuit.

3. The sample/hold circuit according to claim 1, wherein the control means comprises switching means connected between the input terminal and said analog-to-digital converting means, and including means for controlling an on/off operation of said switching means and a latching timing of said latch means.

4. The sample/hold circuit according to claim 1, wherein the control means controls an operation of said analog-to-digital converting means and a latching timing of said latch means.

5. The sample/hold circuit according to claim 1, wherein said memory means includes a ferroelectric memory device.

6. The sample/hold circuit according to claim 1, wherein said memory means includes a FLASH memory device.

7. The sample/hold circuit according to claim 1, wherein said memory means includes an EEPROM device.

* * * * *